(12) United States Patent
Yang et al.

(10) Patent No.: US 11,315,985 B2
(45) Date of Patent: Apr. 26, 2022

(54) DISPLAY PANEL AND METHOD FOR MANUFACTURING THE SAME, AND DISPLAY DEVICE

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Hui Wang, Beijing (CN); Pengcheng Lu, Beijing (CN); Shengnan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 80 days.

(21) Appl. No.: 16/629,558

(22) PCT Filed: Dec. 19, 2018

(86) PCT No.: PCT/CN2018/122039
§ 371 (c)(1),
(2) Date: Jan. 8, 2020

(87) PCT Pub. No.: WO2020/124423
PCT Pub. Date: Jun. 25, 2020

(65) Prior Publication Data
US 2021/0020709 A1    Jan. 21, 2021

(51) Int. Cl.
*H01L 27/32* (2006.01)
*H01L 51/52* (2006.01)
*H01L 51/56* (2006.01)

(52) U.S. Cl.
CPC ........ *H01L 27/3227* (2013.01); *H01L 27/326* (2013.01); *H01L 27/3246* (2013.01);
(Continued)

(58) Field of Classification Search
CPC ............. H01L 27/3227; H01L 27/3246; H01L 27/326; H01L 51/5218; H01L 51/5221;
(Continued)

(56) References Cited

U.S. PATENT DOCUMENTS 5,610,629 A * 3/1997 Baur ...................... G06F 3/0412
345/104
2014/0209887 A1   7/2014 Chang
(Continued)

FOREIGN PATENT DOCUMENTS

CN        203895463 U    10/2014
CN        104297931 A     1/2015
(Continued)

*Primary Examiner* — Dzung Tran
(74) *Attorney, Agent, or Firm* — The Webb Law Firm

(57) ABSTRACT

The present disclosure provides a display panel and a method for manufacturing the same, and a display device. The display panel includes: a substrate; a pixel unit array disposed on one side of the substrate, wherein the pixel unit array comprises a plurality of pixel units, at least one of the plurality of pixel units comprising an anode layer, a cathode layer, and a light emitting layer located between the anode layer and the cathode layer, the cathode layer defining an opening configured to transmit a light emitted from the light emitting layer; and at least one sensor disposed on one side of the pixel unit array away from the substrate and configured to detect a light transmitted through the opening.

18 Claims, 5 Drawing Sheets

(52) U.S. Cl.
CPC ...... *H01L 51/5218* (2013.01); *H01L 51/5221* (2013.01); *H01L 51/5237* (2013.01); *H01L 51/5284* (2013.01); *H01L 51/56* (2013.01); *H01L 2227/323* (2013.01)

(58) Field of Classification Search
CPC . H01L 51/5237; H01L 51/5284; H01L 51/56; H01L 2227/323
USPC .......................................................... 257/40
See application file for complete search history.

(56) References Cited

U.S. PATENT DOCUMENTS

| | | | | |
|---|---|---|---|---|
| 2015/0179724 | A1* | 6/2015 | Lee | H01L 27/3265 257/40 |
| 2016/0260923 | A1* | 9/2016 | Wu | H01L 51/56 |
| 2017/0170245 | A1* | 6/2017 | Lin | H01L 27/3246 |
| 2017/0309226 | A1* | 10/2017 | In | G09G 3/20 |
| 2018/0182836 | A1* | 6/2018 | Beak | H01L 27/3265 |

FOREIGN PATENT DOCUMENTS

| | | |
|---|---|---|
| CN | 106887450 A | 6/2017 |
| CN | 107104131 A | 8/2017 |
| CN | 107316605 A | 11/2017 |

\* cited by examiner

DISPLAY PANEL AND METHOD FOR MANUFACTURING THE SAME, AND DISPLAY DEVICE

CROSS-REFERENCE TO RELATED APPLICATIONS

The present application is a U.S. National Stage Application under 35 U.S.C. § 371 of International Patent Application No. PCT/CN2018/122039, filed on Dec. 19, 2018, the disclosure of which is incorporated by reference herein in its entirety.

TECHNICAL FIELD

The present disclosure relates to the field of display technology, and especially to a display panel, a manufacturing method thereof, and a display device.

BACKGROUND

Compared to a liquid crystal display, an OLED (organic light-emitting diode) display has advantages such as low energy consumption, low production cost, spontaneous light emission, wide viewing angle, and fast response speed.

At present, the OLED display has begun to replace traditional liquid crystal display in display fields such as mobile phone, personal digital assistant (PDA), and digital camera.

SUMMARY

According to one aspect of embodiments of the present disclosure, a display panel is provided. The display panel comprises: a substrate; a pixel unit array disposed on one side of the substrate, wherein the pixel unit array comprises a plurality of pixel units, at least one of the plurality of pixel units comprising an anode layer, a cathode layer, and a light emitting layer located between the anode layer and the cathode layer, the cathode layer defining an opening configured to transmit a light emitted from the light emitting layer; and at least one sensor disposed on one side of the pixel unit array away from the substrate and configured to detect a light transmitted through the opening.

In some embodiments, the cathode layer is located on one side of the light emitting layer away from the substrate.

In some embodiments, the at least one of the plurality of pixel units further comprises a light reflecting portion configured to reflect a part of the light emitted from the light emitting layer to the opening.

In some embodiments, the display panel comprises a pixel defining portion configured to define the plurality of pixel units, wherein a light blocking portion is disposed at the pixel defining portion and configured to block a light reflected by the light reflecting portion from entering other pixel units.

In some embodiments, a projection of the light blocking portion on the substrate is a first projection, a projection of the light reflecting portion on the substrate is a second projection, and a projection of the anode layer on the substrate is a third projection, wherein the second projection is located between the first projection and the third projection.

In some embodiments, a projection of the pixel defining portion on the substrate is a fourth projection, and a projection of the opening on the substrate is a fifth projection, wherein the fourth projection covers the fifth projection.

In some embodiments, the light reflecting portion comprises a first layer located between the light emitting layer and the substrate in a direction perpendicular to a surface of the substrate, wherein a material of the first layer is the same as that of the anode layer.

In some embodiments, the light reflecting portion further comprises a second layer located on one side of the first layer away from the substrate, wherein the second layer comprises a metal material.

In some embodiments, the light reflecting portion further comprises a third layer located on the second layer away from the first layer, wherein a material of the third layer is the same as that of the anode layer.

In some embodiments, the display panel comprises an encapsulation layer disposed between the pixel unit array and the at least one sensor.

In some embodiments, the encapsulation layer fills in the opening.

In some embodiments, the display panel further comprises: a color filter layer disposed on one side of the substrate away from the pixel unit array.

In some embodiments, the cathode layer is opaque.

According to another aspect of embodiments of the present disclosure, a method for manufacturing a display panel is provided. The method comprises: providing a substrate; forming a pixel unit array on one side of the substrate, wherein the pixel unit array comprises a plurality of pixel units, at least one of the plurality of pixel units comprising an anode layer, a cathode layer, and a light emitting layer located between the anode layer and the cathode layer, the cathode layer defining an opening configured to transmit a light emitted from the light emitting layer; and forming at least one sensor on one side of the pixel unit array away from the substrate, wherein the at least one sensor is configured to detect a light transmitted through the opening.

In some embodiments, forming the pixel unit array on the one side of the substrate comprises: forming an anode material layer on the one side of the substrate and a luminescent material layer on one side of the anode material layer away from the substrate, wherein the anode material layer comprises the anode layer for the at least one of the plurality of pixel units, and the luminescent material layer comprises the light emitting layer for the at least one of the plurality of pixel units; providing a mask, wherein the mask comprises: a transparent mask substrate, a light reflecting layer disposed on one side of the transparent mask substrate, wherein the light reflecting layer comprises one or more light reflecting units spaced apart from each other, a light absorbing layer disposed around each of the one or more light reflecting units, and a cathode material layer disposed on one side of the light reflecting layer and the light absorbing layer away from the transparent mask substrate, wherein the cathode material layer comprises a first portion and a second portion other than the first portion, a projection of the first portion on the transparent mask substrate coinciding with a projection of the light reflecting unit on the transparent mask substrate; configuring the mask to make the cathode material layer face the luminescent material layer; and irradiating the transparent mask substrate with a light to make the second portion evaporate and deposit on one side of the luminescent material layer away from the anode material layer to form the cathode layer.

In some embodiments, the light absorbing layer has a thermal conductivity in a direction perpendicular to a surface of the transparent mask substrate greater than that in a direction parallel to the surface of the transparent mask substrate.

In some embodiments, forming the pixel unit array comprises: forming a light reflecting portion of the at least one of the plurality of pixel units, wherein the light reflecting portion is configured to reflect a part of the light emitted from the light emitting layer to the opening.

In some embodiments, forming the light reflecting portion of the at least one of the plurality of pixel units comprises: forming the anode layer and a first layer on the one side of the substrate by a same patterning process, wherein the light reflecting portion comprises the first layer.

In some embodiments, forming the light reflecting portion of the at least one of the plurality of pixel units further comprises: forming a second layer on one side of the first layer away from the substrate, wherein the second layer comprises a metal material and the light reflecting portion further comprises the second layer.

In some embodiments, forming the second layer on the one side of the first layer away from the substrate comprises: forming a second material layer on the one side of the first layer away from the substrate, wherein the second material layer comprises the metal material; forming a third material layer on one side of the second material layer away from the first layer, wherein a material of the third material layer is the same as that of the anode layer; forming a patterned photoresist layer on one side of the third material layer away from the second material layer; etching, with the patterned photoresist layer as a mask, the third material layer and the second material layer to form the second layer and a third layer located on one side of the second layer away from the first layer, wherein the light reflecting portion further comprises the third layer; and removing the patterned photoresist layer.

In some embodiments, forming the at least one sensor on the one side of the pixel unit array away from the substrate comprises: forming an encapsulation layer on the one side of the pixel unit array away from the substrate; forming the at least one sensor on one side of the encapsulation layer away from the pixel unit array.

According to still another aspect of embodiments of the present disclosure, a display device is provided. The display device comprises: the display panel according to any one of the above embodiments.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
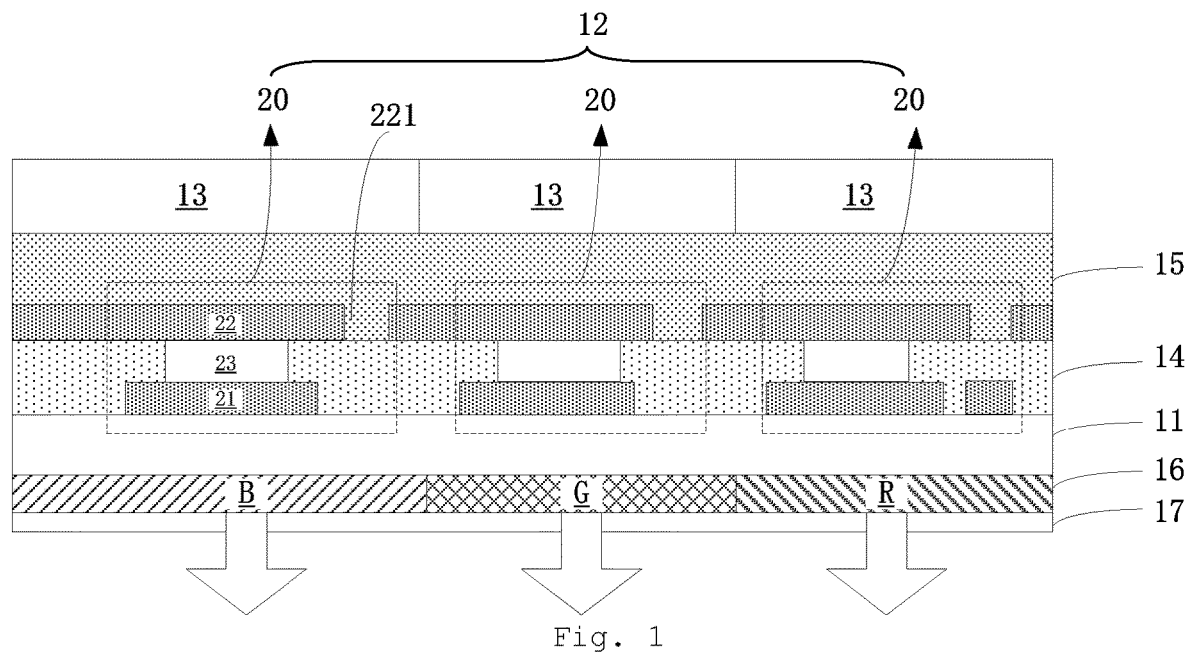
FIG. 1 is a schematic structural view showing a display panel according to one embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

At present, large-sized OLED display panels generally emit light in a bottom light-emitting manner. In order to reduce a voltage drop (IR drop) of the cathode, aluminum is generally used as the cathode. However, since aluminum is opaque, light emitted by the pixel unit cannot pass through the cathode to reach a sensor. Thus, optical compensation for the pixel unit cannot be achieved.

Accordingly, embodiments of the present disclosure provide a solution capable of implementing optical compensation for a pixel unit.

FIG. 1 is a schematic structural view showing a display panel according to one embodiment of the present disclosure.

As shown in FIG. 1, the display panel comprises a substrate 11, a pixel unit array 12, and at least one sensor 13. The pixel unit array 12 is disposed on one side of the substrate 11. The at least one sensor 13 is disposed on one side of the pixel unit array 12 away from the substrate 11.

The substrate 11 may comprise a substrate layer (e.g., a flexible substrate layer) and a planarization layer located on one side of the substrate layer. A thin film transistor array, a capacitor, a resistor, a wiring, and the like may be formed in the planarization layer.

The pixel unit array 12 may comprise a plurality of pixel units 20 (i.e. sub-pixels). It should be understood that, the display panel may further comprise a pixel defining portion 14 for defining the pixel units 20. Different pixel units 20 may be spaced apart by the pixel defining portion 14. At least one of the plurality of pixel units 20 comprises an anode layer 21, a cathode layer 22, and a light emitting layer 23 located between the anode layer 21 and the cathode layer 22. The cathode layer 22 defines an opening 221 configured to be transmit a first part of light emitted from the light-emitting layer 23. In some embodiments, the cathode layer 22 is located on one side of the light emitting layer 23 away from the substrate 11, that is, the anode layer 21 is closer to the substrate 11 than the cathode layer 22.

In some embodiments, the cathode layer 22 itself is opaque. For example, the material of the cathode layer 22 may comprise a metal material such as aluminum. In some embodiments, the material of the anode layer 21 may comprise indium tin oxide (ITO) and the like. In some embodiments, the light emitting layer 23 may comprise an organic electroluminescent material layer. In some embodiments, the light emitting layer 23 may further comprise one or more of an electron transport layer, an electron injection layer, a hole transport layer, and a hole injection layer. The material of the pixel defining portion 14 may comprise, but are not limited to, a resin material. It should be understood that the pixel defining portion 14 is capable of transmitting light.

The sensor 13 is configured to detect the first part of light transmitted through the opening 221. The sensor 13 may be, for example, a PIN (P-type semiconductor-intrinsic semiconductor-N-type semiconductor) type photodiode. However, the present disclosure is not limited thereto, and the sensor 13 may also be other types of optical sensors capable of detecting light.

In some embodiments, an encapsulation layer 15 of the display panel may be disposed between the pixel unit array 12 and the sensor 13. That is, the sensor 13 may be disposed on one side of the encapsulation layer 15 away from the pixel unit array 12. For example, the encapsulation layer 15 may fill the opening 221. In some implementations, the encapsulation layer 15 may comprise a first inorganic layer, a second inorganic layer, and an organic layer between the first inorganic layer and the second inorganic layer. It should be understood that the encapsulation layer 15 is capable of transmitting light.

In some embodiments, the cathode layer 22 of each pixel unit 20 may define an opening 221 configured to transmit a light emitted by the corresponding light emitting layer 23. Correspondingly, the display panel may comprise a plurality of sensors 13, each of which is configured to detect the light transmitted through the corresponding opening 221.

In the above embodiments, the cathode layer of at least one pixel unit defines an opening configured to transmit the light emitted from the light emitting layer of the pixel unit, and the sensor may detect the light transmitted through the opening. The optical compensation for the pixel unit may be made by using the detected light.

In addition, in the display panel provided by embodiments of the present disclosure, compensation for the pixel unit may be made without a pixel compensation circuit inside the pixel unit. Thus it is possible to reduce the number of thin film transistors inside the pixel unit and improve the aperture ratio of the display panel.

In some embodiments, referring to FIG. 1, the display panel may further comprise a color filter layer 16 disposed on one side of the substrate 11 away from the pixel unit array 12. The arrow below the color filter layer 16 indicates a light exiting direction of the display panel. The color filter layer 16 may comprise, for example, a red filter R, a green filter G, and a blue filter B. In this case, the light emitted from each pixel unit 20 in the pixel unit array 12 may be white light. However, the present disclosure is not limited thereto. In other embodiments, the light emitted from each pixel unit 20 in the pixel unit array 12 may not be white light, that is, different pixel units 20 may emit light of different colors. In this case, the display panel may not comprise the color filter layer 16.

In some embodiments, referring to FIG. 1, the display panel may further comprise a cover plate 17, such as a glass cover plate, disposed on one side of the color filter layer 16 away from the substrate 11.

Different embodiments of the display panel will be introduced below with reference to FIGS. 2A-2C and 3. In the following description, only the differences from the foregoing embodiments are mainly introduced. For other aspects that are the same or similar, reference may be made to the foregoing description. In addition, it should be understood that certain members shown in FIGS. 2A-2C and 3 such as the color filter layer 16 and the like, are not necessary in some embodiments.

Figure 2A:
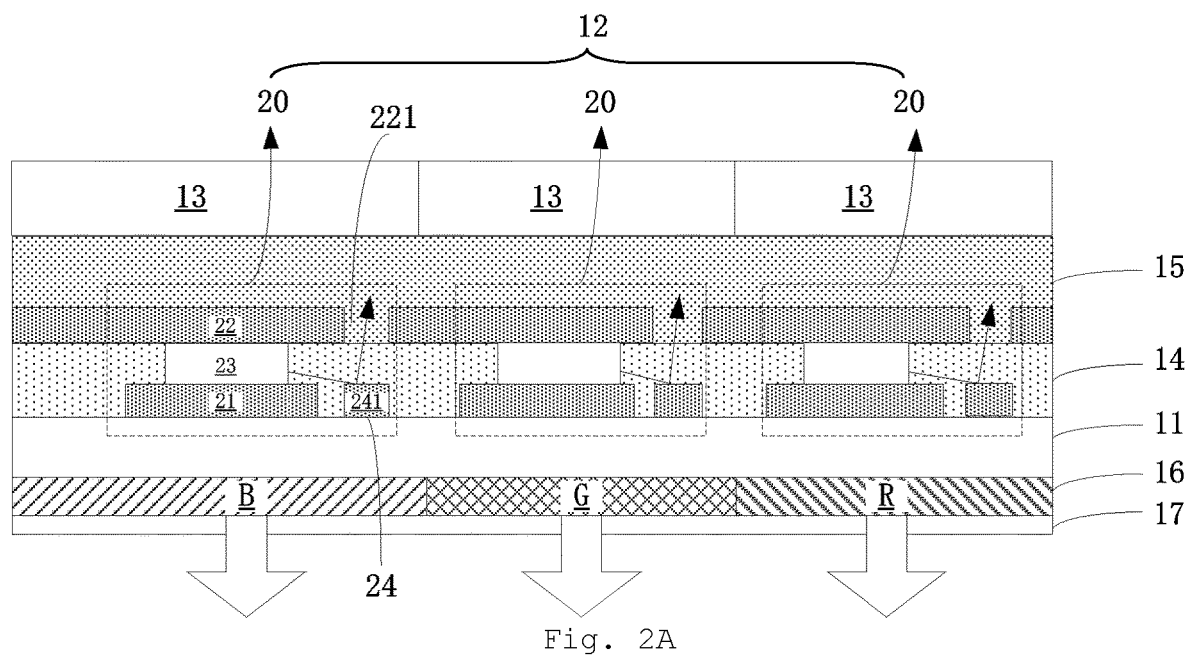
FIGS. 2A-2C are schematic structural views showing a display panel according to some embodiments of the present disclosure.
Figure 2B:
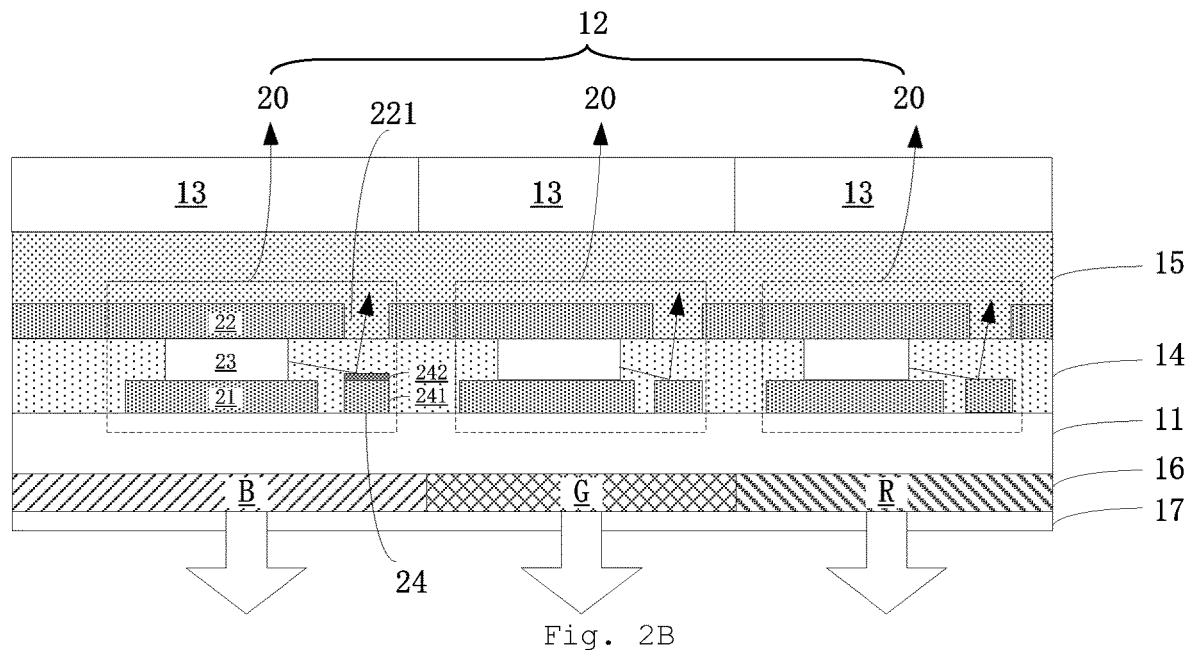
Figure 2C:
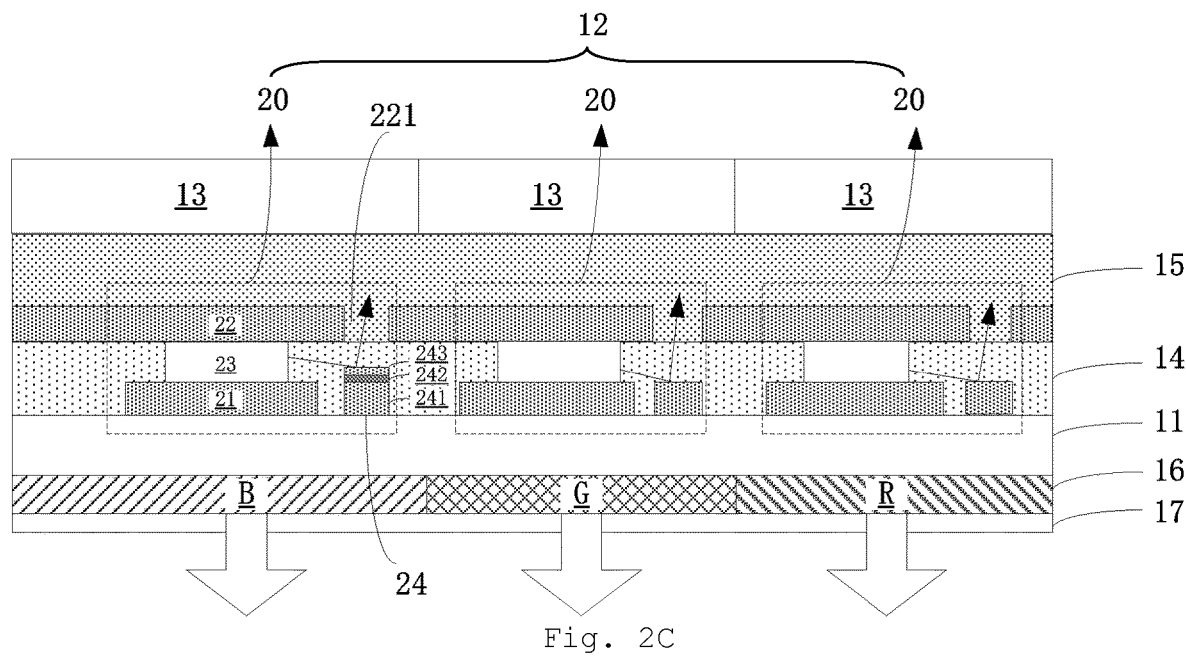

FIGS. 2A-2C are schematic structural views showing a display panel according to some embodiments of the present disclosure. Compared to the display panel shown in FIG. 1, the pixel unit 20 in the display panel shown in FIGS. 2A to 2C may further comprise a light reflecting portion 24. The light reflecting portion 24 is configured to reflect a second part of the light emitted from the light emitting layer 23 to the opening 221. It should be understood that the first part of light may comprise the second part of light reflected by the light reflecting portion 24. The first part of light may also comprise third part of light directly from the light emitting layer 23. Thus, the light incident to the opening 221 may be increased, thereby facilitating detection of the light transmitted through the opening 221 by the sensor 13.

Different implementations of the light reflecting portion 24 will be introduced below with reference to FIGS. 2A to 2C.

In some embodiments, referring to FIG. 2A, the light reflecting portion 24 may comprise a first layer 241. The material of the first layer 241, for example ITO, is the same as that of the anode layer 21. The first layer 241 is located between the light emitting layer 23 and the substrate 11 in a direction perpendicular to the surface of the substrate 11. In some embodiments, the first layer 241 and the anode layer 21 may be formed on one side of the substrate 11 by the same patterning process. That is, the first light layer 241 and the anode layer 21 may be formed simultaneously by patterning the same material.

In other embodiments, referring to FIG. 2B, the light reflecting portion 24 may further comprise a second layer 241 located on one side of the first layer 241 away from the substrate 11. The second layer 241 comprises a metal material such as a silver. Such a light reflecting portion 24 may more effectively reflect a part of the light emitted from the light emitting layer 23 to the opening 221.

In still other embodiments, referring to FIG. 2C, the light reflecting portion 24 may further comprise a third layer 243 located on one side of the second layer 242 away from the first layer 241. The material of the third layer 243 is the same as that of the anode layer 241. The presence of the third layer 243 makes the implementation of the preparation process of the second layer 242 easier, which will be described later in conjunction with the method of forming the second layer 242.

Figure 3:
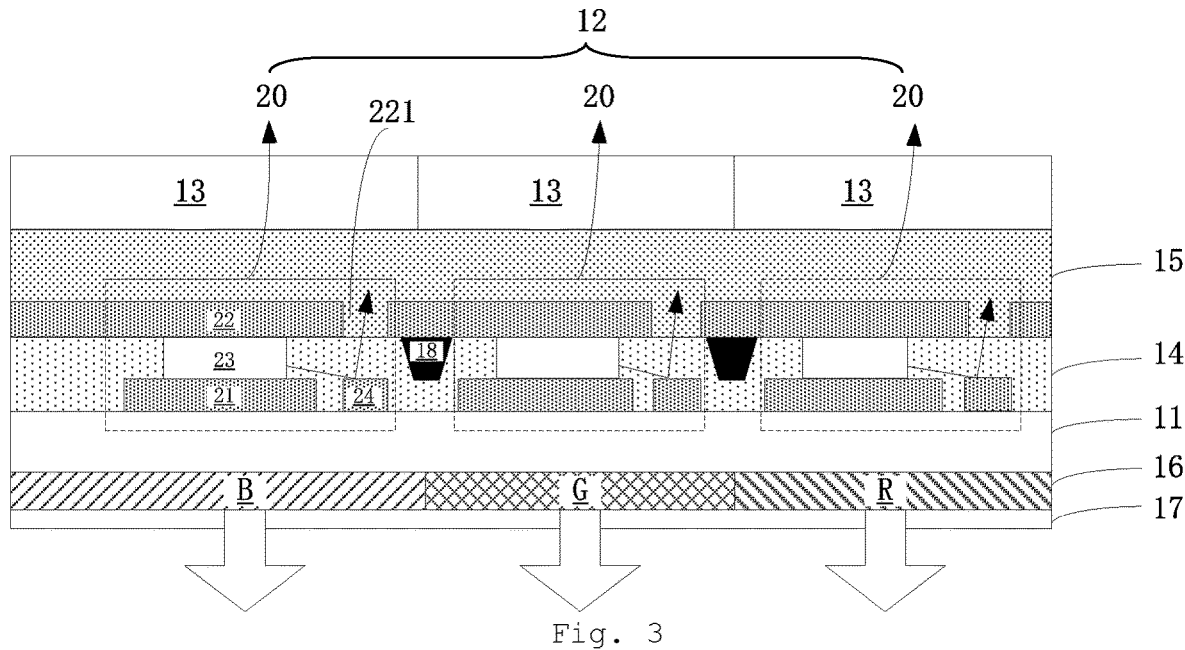
FIG. 3 is a schematic structural view showing a display panel according to another embodiment of the present disclosure.

FIG. 3 is a schematic structural view showing a display panel according to another embodiment of the present disclosure.

Compared to the display panels shown in FIGS. 2A to 2C, a light blocking portion 18 is disposed at the pixel defining portion 14 in the display panel shown in FIG. 3. The light blocking portion 18 is configured to block the light reflected by the light reflecting portion 24 from entering other pixel units 20, for example, a pixel unit 20 adjacent to the pixel unit 20 where the light reflecting portion 24 is located. It should be understood that the light blocking portion 18 may also be configured to block the light emitted from the light emitting layer 23 from entering other pixel units 20.

It should be noted that the light reflecting portion 24 shown in FIG. 3 may be the light reflecting portion 24 provided by any one of the embodiments in FIGS. 2A to 2C.

In some implementations, the light blocking portion 18 may be disposed in the pixel defining portion 14, as shown in FIG. 3. In other implementations, the light blocking portion 18 may be disposed on one side of the pixel defining portion 14 away from the substrate 11. As some examples, the material of the light blocking portion 18 may be a photoresist or the like, such as a negative photoresist.

In some embodiments, the projection of the light blocking portion 18 on the substrate 11 is a first projection, the projection of the light reflecting portion 24 on the substrate is a second projection, and the projection of the anode layer 21 on the substrate 11 is a third projection. The second projection is located between the first projection and the third projection, as shown in FIG. 3.

In the above embodiments, the light blocking portion may block the light reflected by the light reflecting portion from entering other pixel units. Thus, the light emitted from other pixel units detected by the sensor corresponding to a pixel unit may be reduced, and the accuracy of the light detected by the sensor is improved. Thus, the pixel unit may be more accurately compensated.

In some embodiments, the projection of the pixel defining portion 14 on the substrate 11 is a fourth projection, and the projection of the opening 221 on the substrate 11 is a fifth projection. The fourth projection may cover the fifth projection, as shown in FIGS. 1-3. In other words, the fifth projection is within the fourth projection.

Figure 4:
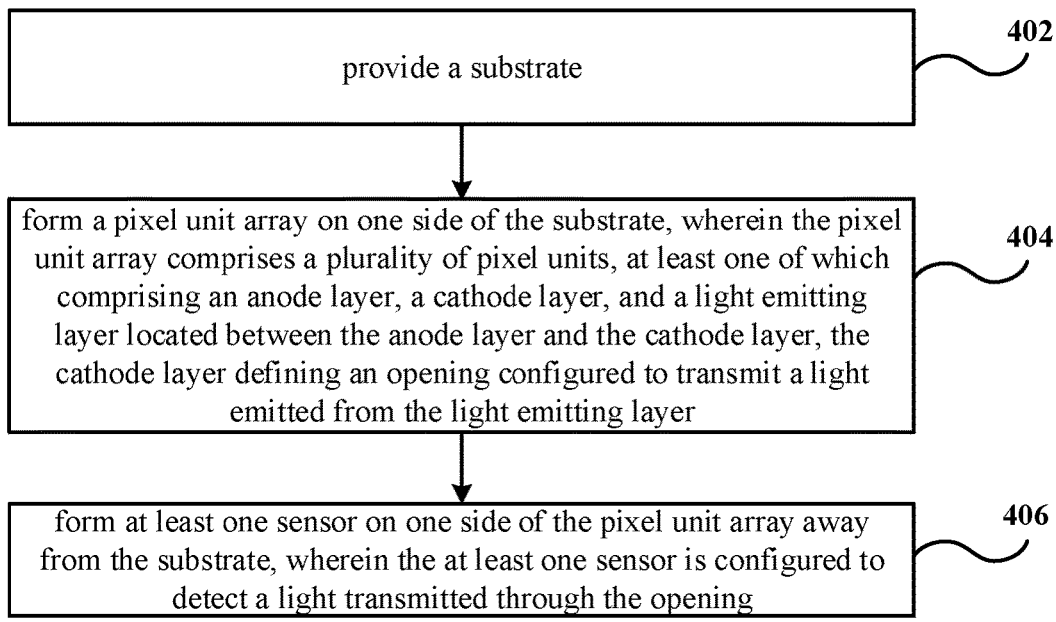
FIG. 4 is a schematic flow chart showing a method for manufacturing a display panel according to one embodiment of the present disclosure.

FIG. 4 is a schematic flow chart showing a method for manufacturing a display panel according to one embodiment of the present disclosure.

At step 402, a substrate is provided. Here, the substrate may comprise a substrate layer and a planarization layer on one side of the substrate layer. A thin film transistor or the like may be formed in the planarization layer.

At step 404, a pixel unit array is formed on one side of the substrate. The pixel unit array comprises a plurality of pixel units. At least one of the plurality of pixel units comprises an anode layer, a cathode layer, and a light emitting layer located between the anode layer and the cathode layer. The cathode layer defines an opening configured to transmit a first part of light emitted from a corresponding light emitting layer. In some embodiments, the cathode layer is opaque. For example, the material of the cathode layer may comprise aluminum.

In some embodiments, a color filter layer may be disposed on one side of the substrate away from the pixel unit array. A cover plate may be disposed on one side of the color filter layer away from the substrate.

At step 406, at least one sensor is formed on one side of the pixel unit array away from the substrate. The at least one sensor is configured to detect the first part of light transmitted through the opening.

In some embodiments, an encapsulation layer may be formed first on one side of the pixel unit array away from the substrate and then at least one sensor is formed on one side of the encapsulation layer away from the pixel unit array. For example, the encapsulation layer may fill the opening.

In the above embodiments, the cathode layer of at least one pixel unit defines an opening configured to transmit the light emitted from the light emitting layer of the pixel unit and the sensor may detect the light transmitted through the opening. Thus, optical compensation for the pixel unit may be made by using the detected light.

FIGS. 5A-5D are schematic views showing structures obtained at different stages of forming a pixel unit array according to some implementations of the present disclosure.

Figure 5A:
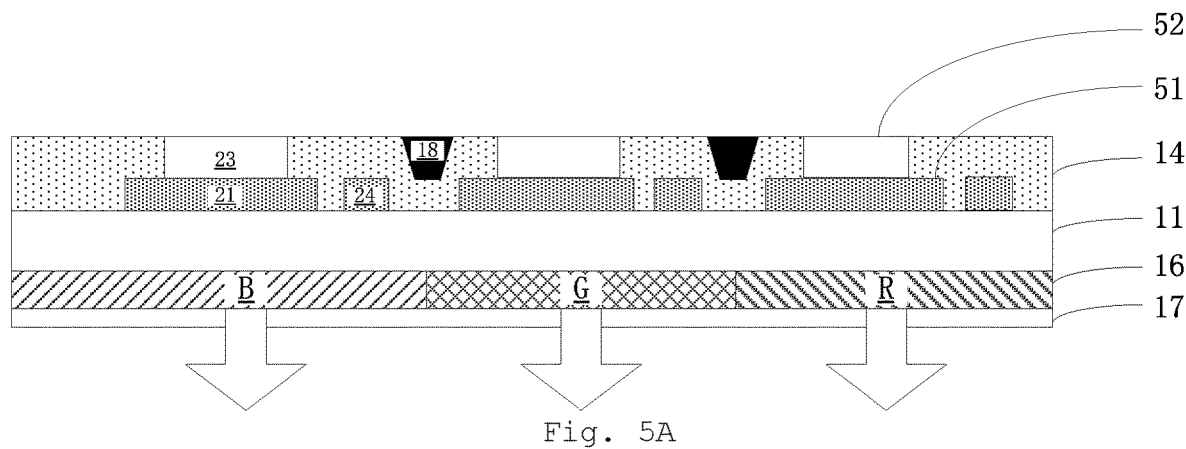
FIGS. 5A-5D are schematic views showing structures obtained at different stages of forming a pixel unit array according to some implementations of the present disclosure.

As shown in FIG. 5A, an anode material layer 51 and a luminescent material layer 52 located on one side of the anode material layer 51 away from the substrate 11 are formed on one side of the substrate 11. The anode material layer 51 comprises an anode layer 21 for a pixel unit, and the luminescent material layer 52 comprises a light emitting layer 23 for the pixel unit. Here, the pixel unit is a pixel unit of which a cathode layer formed later defines an opening.

In some embodiments, a color filter layer 16 may be disposed on the other side, that is, one side away from the pixel unit array formed later, of the substrate 11. A cover 17 may be disposed on one side of the color filter layer 16 away from the substrate 11.

For example, the anode material layer 51 may be formed first, and then the pixel defining portion 14 is formed, and afterwards the luminescent material layer 52 is formed.

In some embodiments, a light reflecting portion 24 for the pixel unit 10 may be further formed. For example, the light reflecting portion 24 and the anode layer 21 may be prepared by the same patterning process.

Here, the light reflecting portion 24 may be the light reflecting portion 24 in any one of the embodiments in FIGS. 2A to 2C.

Different implementations of forming the light reflecting portion 24 will be described below.

In some implementations, the anode layer 21 and the first layer 241 may be simultaneously formed on one side of the substrate by the same patterning process. In such implementations, referring to FIG. 2A, the light reflecting portion 24 comprises a first layer 241.

In other implementations, after the first layer 241 is formed, the second layer 242 may be further formed on one side of the first layer 241 away from the substrate 11. Here, the second layer 242 comprises a metal material such as a silver or the like. In such implementations, referring to FIG. 2B, the light reflecting portion 24 comprises the first layer 241 and the second layer 242.

Some implementations of forming the second layer 242 are introduced below.

First, a second material layer may be formed on one side of the first layer 241 away from the substrate 11. Here, the second material layer comprises a metal material such as a silver.

Then, a third material layer may be formed on one side of the second material layer away from the first layer 241. Here, the material of the third material layer is the same as that of the anode layer 21.

Next, a patterned photoresist layer is formed on one side of the third material layer away from the second material layer.

After that, the third material layer and the second material layer are etched with the patterned photoresist layer as a mask to form the second layer 242 and the third layer 243 located on one side of the second layer 242 away from the first layer 241.

After that, the patterned photoresist layer is removed.

In such implementations, referring to FIG. 2C, the light reflecting portion 24 comprises the first layer 241, the second layer 242, and the third layer 243.

In the above implementations, during the process of forming the second layer 242, instead of forming a photoresist layer directly on the second material layer comprising a metal material, the third material layer is formed first on the second material layer, and the photoresist layer is then formed on the third material layer. In this way, the problem that the photoresist layer is not easily removed resulting from an excessive binding force between the photoresist layer and the second material layer is avoided.

In some embodiments, after the pixel defining portion 14 is formed, one or more light blocking portions 18 that are spaced apart from each other may be formed at the pixel defining portion 14 (e.g., in an opening of the pixel defining portion 14 or on one side of the pixel defining portion 14 away from the substrate 11). The light blocking portion 18 is configured to block the light reflected by the light reflecting portion 24 in a certain pixel unit from entering other pixel units other than this pixel unit.

Figure 5B:
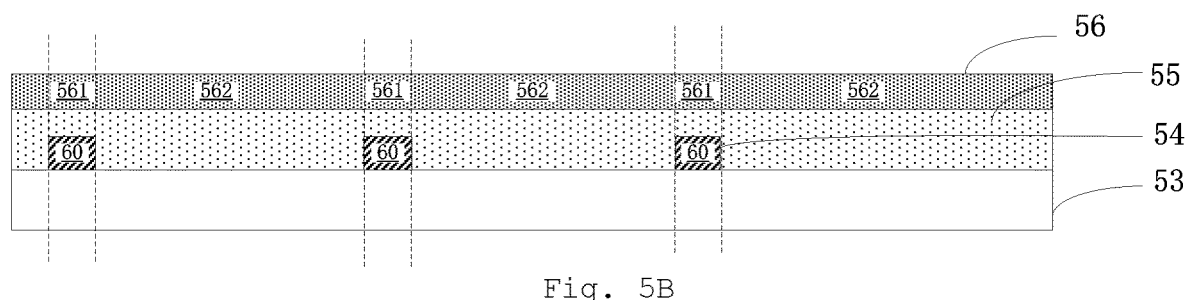

As shown in FIG. 5B, a mask is provided. The mask comprises a transparent mask substrate 53 (for example, a transparent substrate such as a glass substrate), a light reflecting layer 54, a light absorbing layer 55, and a cathode material layer 56.

The light reflecting layer 54 is disposed on one side of the transparent mask substrate 53. The light reflecting layer 54 comprises one or more light reflecting units 60 that are spaced apart from each other. FIG. 5B schematically shows three light reflecting units 60. In some embodiments, the material of the light reflecting unit 60 may comprise, for example, a metal material with a high reflection coefficient, such as aluminum, molybdenum, or silver. For example, the position of the light reflecting unit 60 in the mask may be determined according to the position of the opening of the cathode layer formed later.

The light absorbing layer 55 is disposed around each light reflecting unit 60. In some embodiments, referring to FIG. 5B, the light absorbing layer 55 may also cover the light reflecting layer 54. In some embodiments, the material of the light absorbing layer 55 may comprise a material with a high light absorbing coefficient such as a black matrix.

The cathode material layer 56 is disposed on one side of the light reflecting layer 54 and the light absorbing layer 55 away from the transparent mask substrate 53. The cathode material layer 56 comprises a first portion 561 and a second portion 562 other than the first portion 561. Here, the projection of the first portion 561 on the transparent mask substrate 53 coincides with the projection of the light reflecting unit 60 on the transparent mask substrate 53.

Figure 5C:
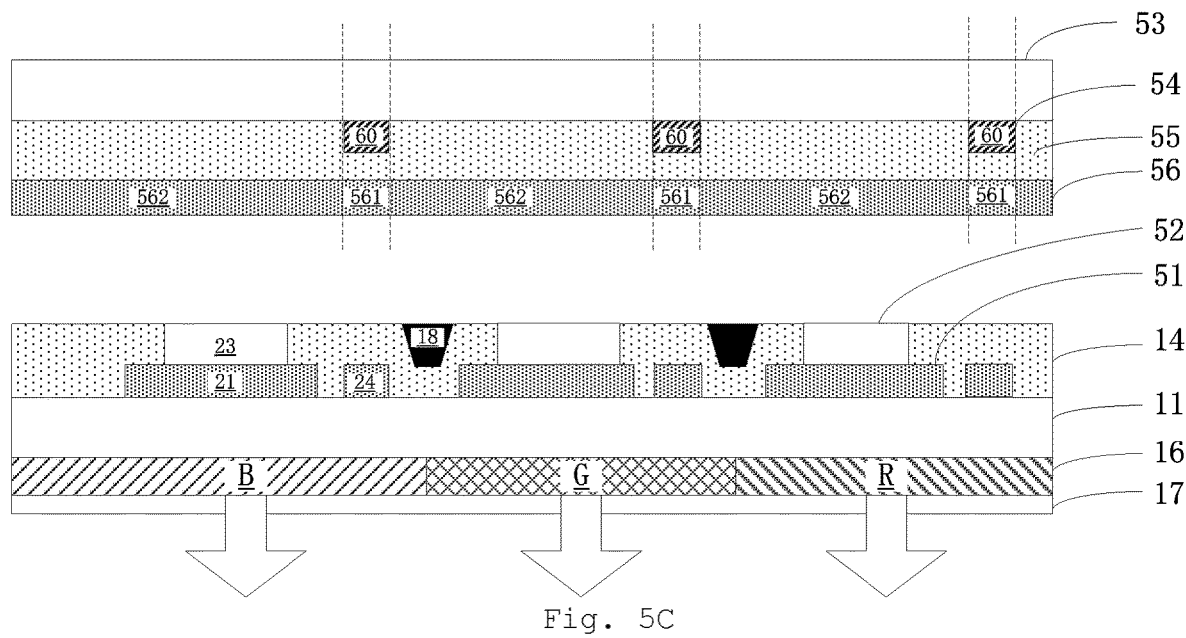

As shown in FIG. 5C, the mask shown in FIG. 5B is configured to make the cathode material layer 56 face the luminescent material layer 52.

Figure 5D:
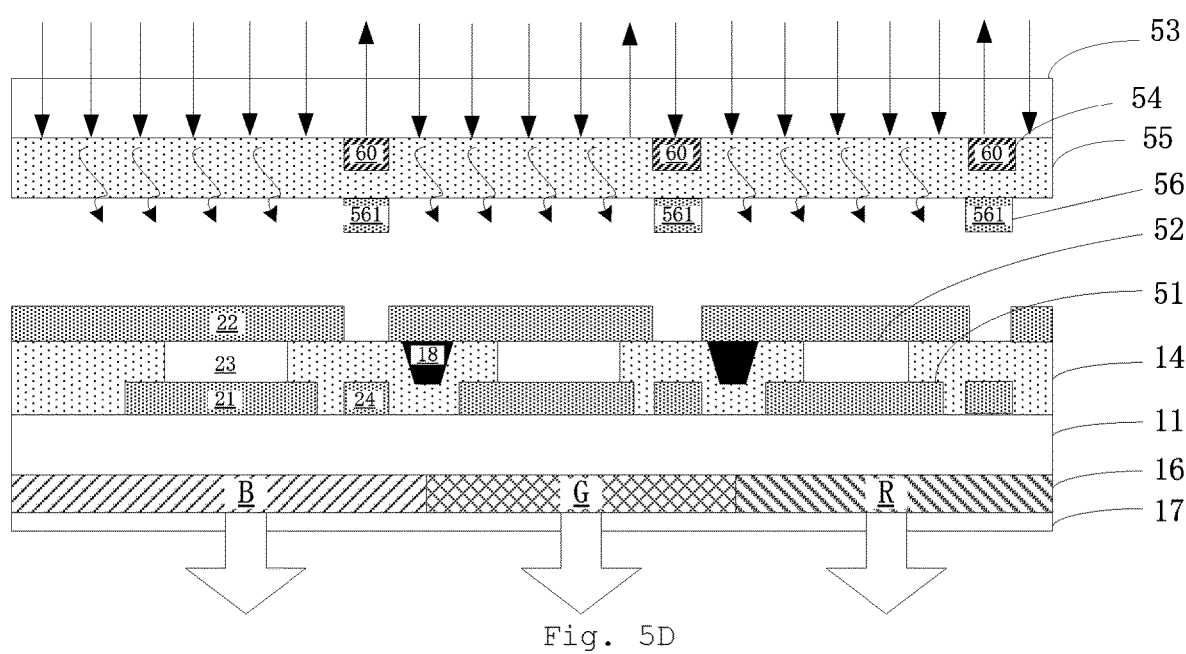

As shown in FIG. 5D, the transparent mask substrate 53 is irradiated with a light to make the second portion 562 evaporate and deposit on one side of the luminescent material layer 23 away from the anode material layer 21 to form the cathode layer 22.

As some examples, the light may comprise, for example, X-ray, ultraviolet ray, and the like. It should be understood that, the light is related to the material of each layer in the mask. In practical applications, an appropriate light may be chosen according to different situations.

After the transparent mask substrate 53 is irradiated with a light, the heat of the light absorbing layer 55 increases under the irradiation of light to make the second portion 562 of the cathode material layer 56 evaporate. The evaporated particles deposit on one side of the luminescent material layer 23 away from the anode material layer 21 to form a cathode layer 22. Since the light reflecting unit 60 may reflect the light, the first portion 561 of the cathode material layer 56 will not evaporate. In this way, patterning of the cathode material layer 56 is implemented.

In some embodiments, the light absorbing layer 55 has a thermal conductivity coefficient in a direction perpendicular to the surface of the transparent mask substrate 53 greater than that in a direction parallel to the surface of the transparent mask substrate 53. More heat in the light absorbing layer 55 may be transferred along the direction perpendicular to the surface of the transparent mask substrate 53, which is more favorable for the evaporating the second portion 562 of the cathode material layer. Thus, the position of the opening of the cathode layer 22 may be better controlled.

Figure 6:
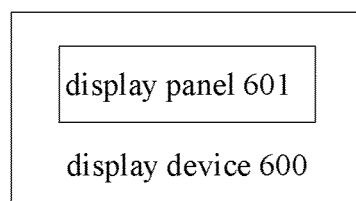
FIG. 6 is a schematic structural view showing a display device according to one embodiment of the present disclosure.

FIG. 6 is a schematic structural view showing a display device according to one embodiment of the present disclosure.

As shown in FIG. 6, the display device 600 may comprise the display panel 601 according to any one of the above embodiments. In some embodiments, the display device 600 may be, for example, any product or member having a display function, such as a mobile terminal, a television, a display, a notebook computer, a digital photo frame, a navigator, or an electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
a substrate;
a pixel unit array disposed on one side of the substrate, wherein the pixel unit array comprises a plurality of pixel units, at least one of the plurality of pixel units comprising an anode layer, a cathode layer, and a light emitting layer located between the anode layer and the cathode layer, the cathode layer defining an opening;
at least one sensor disposed on one side of the pixel unit array away from the substrate and configured to detect a first part of light transmitted through the opening; and
a color filter layer disposed on one side of the substrate away from the pixel unit array, wherein:
the at least one of the plurality of pixel units further comprises a light reflecting layer configured to reflect a second part of light emitted from the light emitting layer to the opening, the light reflecting layer and the anode layer being located on a same surface of the substrate and being separated from each other, and
the first part of light comprises the second part of light and a third part of light directly from the light emitting layer.

2. The display panel according to claim 1, wherein the cathode layer is located on one side of the light emitting layer away from the substrate.

3. The display panel according to claim 1, wherein the display panel comprises a pixel defining layer configured to define the plurality of pixel units, wherein a light blocking layer is disposed at the pixel defining layer and configured to block a light reflected by the light reflecting layer of one of the plurality of pixel units from entering other pixel units other than the one of the plurality of pixel units.

4. The display panel according to claim 3, wherein a projection of the light blocking layer on the substrate is a first projection, a projection of the light reflecting layer on the substrate is a second projection, and a projection of the anode layer on the substrate is a third projection, wherein the second projection is located between the first projection and the third projection.

5. The display panel according to claim 3, wherein a projection of the pixel defining layer on the substrate is a fourth projection, and a projection of the opening on the substrate is a fifth projection, wherein the fourth projection covers the fifth projection.

6. The display panel according to claim 1, wherein the light reflecting layer comprises a first layer located between the light emitting layer and the substrate in a direction perpendicular to a surface of the substrate, wherein a material of the first layer is the same as that of the anode layer.

7. The display panel according to claim 6, wherein the light reflecting layer further comprises a second layer located on one side of the first layer away from the substrate, wherein the second layer comprises a metal material.

8. The display panel according to claim 7, wherein the light reflecting layer further comprises a third layer located on the second layer away from the first layer, wherein a material of the third layer is the same as that of the anode layer.

9. The display panel according to claim 1, wherein the display panel comprises an encapsulation layer disposed between the pixel unit array and the at least one sensor.

10. The display panel according to claim 9, wherein the encapsulation layer is in the opening.

11. The display panel according to claim 1, wherein the cathode layer is opaque.

12. A display device, comprising: a display panel comprising:
a substrate;
a pixel unit array disposed on one side of the substrate, wherein the pixel unit array comprises a plurality of pixel units, at least one of the plurality of pixel units comprising an anode layer, a cathode layer, and a light emitting layer located between the anode layer and the cathode layer, the cathode layer defining an opening;
at least one sensor disposed on one side of the pixel unit array away from the substrate and configured to detect a first part of light transmitted through the opening; and
a color filter layer disposed on one side of the substrate away from the pixel unit array, wherein:
the at least one of the plurality of pixel units further comprises a light reflecting layer configured to reflect a second part of light emitted from the light emitting layer to the opening, the light reflecting layer and the anode layer being located on a same surface of the substrate and being separated from each other, and
the first part of light comprises the second part of light and a third part of light directly from the light emitting layer.

13. A method for manufacturing a display panel, comprising:
providing a substrate;
forming a pixel unit array on one side of the substrate and a color filter layer on one side of the substrate away from the pixel unit array, wherein the pixel unit array comprises a plurality of pixel units, at least one of the plurality of pixel units comprising an anode layer, a cathode layer, and a light emitting layer located between the anode layer and the cathode layer, the cathode layer defining an opening; and
forming at least one sensor on one side of the pixel unit array away from the substrate, wherein the at least one sensor is configured to detect a first part of light transmitted through the opening,
wherein forming the pixel unit arraycomprises: forming a light reflecting layer of the at least one of the plurality of pixel units, wherein the light reflecting layer is configured to reflect a second part of light emitted from the light emitting layer to the opening, the light reflecting layer and the anode layer being located on a same surface of the substrate and being separated from each other, and
wherein the first part of light comprises the second part of light and a third part of light directly from the light emitting layer.

14. The method according to claim 13, wherein forming the pixel unit array on the one side of the substrate comprises:
forming an anode material layer on the one side of the substrate and a luminescent material layer on one side of the anode material layer away from the substrate, wherein the anode material layer comprises the anode layer for the at least one of the plurality of pixel units, and the luminescent material layer comprises the light emitting layer for the at least one of the plurality of pixel units;

providing a mask, wherein the mask comprises:

a transparent mask substrate, a light reflecting layer disposed on one side of the transparent mask substrate, wherein the light reflecting layer comprises one or more light reflecting units spaced apart from each other, a light absorbing layer disposed around each of the one or more light reflecting units, and a cathode material layer disposed on one side of the light reflecting layer and the light absorbing layer away from the transparent mask substrate, wherein the cathode material layer comprises a first portion and a second portion other than the first portion, a projection of the first portion on the transparent mask substrate coinciding with a projection of the light reflecting unit on the transparent mask substrate;

configuring the mask to make the cathode material layer face the luminescent material layer; and irradiating the transparent mask substrate with a light to make the second portion evaporate and deposit on one side of the luminescent material layer away from the anode material layer to form the cathode layer.

15. The method according to claim 14, wherein the light absorbing layer has a thermal conductivity in a direction perpendicular to a surface of the transparent mask substrate greater than that in a direction parallel to the surface of the transparent mask substrate.

16. The method according to claim 14, wherein forming the light reflecting layer of the at least one of the plurality of pixel units comprises:

forming a first layer on the one side of the substrate by a patterning process the same as that of forming the anode layer, wherein the light reflecting layer comprises the first layer.

17. The method according to claim 16, wherein forming the light reflecting layer of the at least one of the plurality of pixel units further comprises:

forming a second layer on one side of the first layer away from the substrate, wherein the second layer comprises a metal material and the light reflecting layer further comprises the second layer.

18. The method according to claim 17, wherein forming the second layer on the one side of the first layer away from the substrate comprises:

forming a second material layer on the one side of the first layer away from the substrate, wherein the second material layer comprises the metal material;

forming a third material layer on one side of the second material layer away from the first layer, wherein a material of the third material layer is the same as that of the anode layer;

forming a patterned photoresist layer on one side of the third material layer away from the second material layer;

etching, with the patterned photoresist layer as a mask, the third material layer and the second material layer to form the second layer and a third layer located on one side of the side of the second layer away from the first layer, wherein the light reflecting layer further comprises the third layer; and removing the patterned photoresist layer.

* * * * *